United States Patent
Lee

(10) Patent No.: US 10,867,656 B2
(45) Date of Patent: Dec. 15, 2020

(54) MEMORY PERFORMING REFRESH OPERATION AND OPERATION METHOD OF THE SAME

(71) Applicant: SK hynix Inc., Gyeonggi-do (KR)

(72) Inventor: Yo-Sep Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/427,418

(22) Filed: May 31, 2019

(65) Prior Publication Data

US 2020/0090733 A1    Mar. 19, 2020

(30) Foreign Application Priority Data

Sep. 18, 2018  (KR) .................. 10-2018-0111537

(51) Int. Cl.
  *G11C 11/406*  (2006.01)
  *G11C 11/4076*  (2006.01)
  *G11C 11/408*  (2006.01)

(52) U.S. Cl.
  CPC ...... *G11C 11/40618* (2013.01); *G11C 11/408* (2013.01); *G11C 11/4076* (2013.01)

(58) Field of Classification Search
  CPC .......... G11C 11/40618; G11C 11/4076; G11C 11/408; G11C 11/406; G11C 11/40622; G06F 13/1636
  See application file for complete search history.

(56) References Cited

U.S. PATENT DOCUMENTS

| | | | | |
|---|---|---|---|---|
| 8,953,403 | B1* | 2/2015 | Song ................ | G11C 11/40618 365/222 |
| 2005/0002254 | A1* | 1/2005 | Otsuka ................ | G11C 11/406 365/222 |
| 2007/0147154 | A1* | 6/2007 | Lee ................ | G11C 11/406 365/222 |
| 2015/0206571 | A1* | 7/2015 | Ko ................ | G11C 11/40618 365/222 |
| 2016/0027491 | A1* | 1/2016 | Kim ................ | G11C 11/40618 365/222 |
| 2016/0111140 | A1* | 4/2016 | Joo ................ | G11C 11/40611 365/222 |

FOREIGN PATENT DOCUMENTS

KR    10-2017-0109163    9/2017

* cited by examiner

*Primary Examiner* — Ajay Ojha
(74) *Attorney, Agent, or Firm* — IP & T Group LLP

(57) ABSTRACT

A memory includes: first to $N^{th}$ areas refreshed based on first to $N^{th}$ refresh control signals, respectively; a control signal generation circuit suitable for generating the second to $N^{th}$ refresh control signals by sequentially delaying the first refresh control signal, and generating the first refresh control signal by delaying the $N^{th}$ refresh control signal; an address counter suitable for changing a refresh address, corresponding to each round for activations of the first to $N^{th}$ refresh control signals, based on the $N^{th}$ refresh control signal; and a refresh stop circuit suitable for stopping a refresh operation when the round is repeated by a predetermined number.

13 Claims, 6 Drawing Sheets

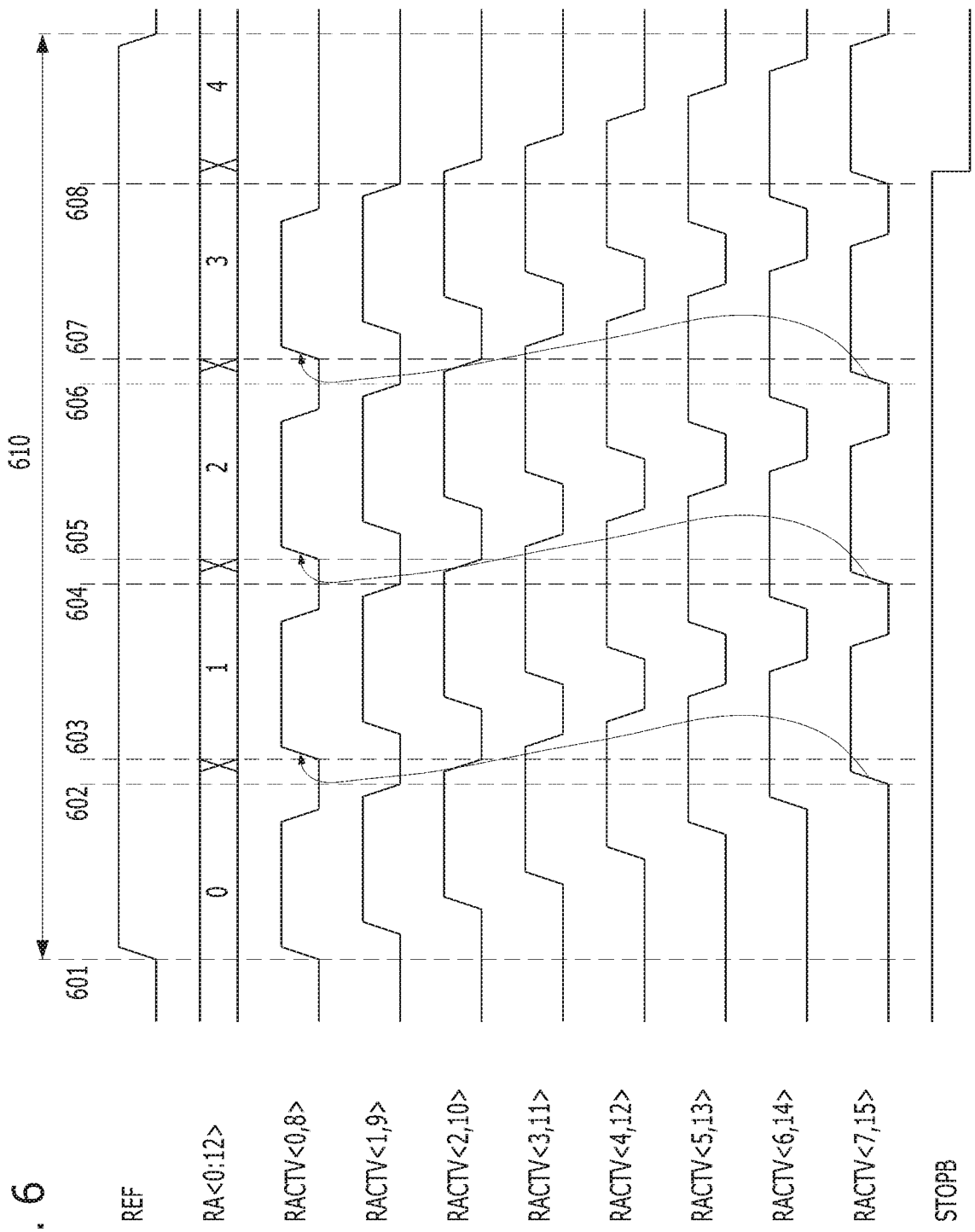

MEMORY PERFORMING REFRESH OPERATION AND OPERATION METHOD OF THE SAME

CROSS-REFERENCE TO RELATED APPLICATIONS

The present application claims priority under 35 U.S.C. § 119(a) to Korean Patent Application No. 10-2018-0111537, filed on Sep. 18, 2018, which is incorporated herein by reference in its entirety.

BACKGROUND

1. Field

Various embodiments of the present invention relate to a memory, and more particularly, to a refresh method of a memory.

2. Description of the Related Art

Each memory cell of a memory includes a transistor serving as a switch and a capacitor storing charges which represent data. Whether data is in a 'high' level (i.e., a logic value of '1') or a 'low' level (i.e., a logic value of '0') is decided based on whether the capacitor of the memory cell is charged or not, in other words, whether a voltage of a storage node of the capacitor is high or low.

Data are retained in the form of charges that are accumulated in the capacitor. Therefore, there is theoretically no power consumption for retaining data. However, since current leakage occurs due to such reasons as a P-N Junction in a MOS transistor, the initial amount of charges in the capacitor disappears, which means that the data may be lost. To prevent data from being lost, the data is read out of the memory cell before the data gets lost, and then the memory cell is charged/discharged again to have the normal amount of charges depending on the read data. This operation has to be repeated periodically to retain the data. Such operation of re-charging/re-discharging on a memory cell is referred to as a refresh operation.

A refresh operation of a memory is performed whenever a refresh command is applied from a memory controller. The memory controller applies a refresh command to the memory at a predetermined time in consideration of a data retention time of a corresponding memory. For example, in a case where a data retention time of a memory is 64 ms and a refresh command has to be applied 8,000 times to the memory to refresh all the memory cells inside the memory, a memory controller applies the refresh command 8,000 times for 64 ms. Since a total number of rows of a memory is increased as a capacity of the memory is increased, the number of rows to be refreshed whenever a refresh command is issued once, is also increases. Therefore, it is required to develop a method for efficiently refreshing a plurality of rows during a refresh cycle time (i.e., tRFC) allowed for each refresh command.

SUMMARY

Embodiments of the present invention are directed to a method for effectively refreshing a plurality of areas of a memory.

In accordance with an embodiment of the present invention, a memory includes: first to $N^{th}$ areas refreshed based on first to $N^{th}$ refresh control signals, respectively; a control signal generation circuit suitable for generating the second to $N^{th}$ refresh control signals by sequentially delaying the first refresh control signal, and generating the first refresh control signal by delaying the $N^{th}$ refresh control signal; an address counter suitable for changing a refresh address, corresponding to each round for activations of the first to $N^{th}$ refresh control signals, based on the $N^{th}$ refresh control signal; and a refresh stop circuit suitable for stopping a refresh operation when the round is repeated by a predetermined number.

In accordance with another embodiment of the present invention, a method for performing a refresh operation in a memory including first to $N^{th}$ areas (where N is an integer equal to or greater than 2) includes: sequentially refreshing the first to $N^{th}$ areas for a $K^{th}$ address (where K is an integer equal to or greater than 0); starting a refresh operation for a $(K+1)^{th}$ address in the first area before a refresh operation for the $K^{th}$ address in the $N^{th}$ area is completed; and sequentially refreshing the second to $N^{th}$ regions for the $(K+1)^{th}$ address.

In accordance with another embodiment of the present invention, a memory includes: a plurality of memory banks that are grouped for a refresh operation and refreshed based on a row address and a plurality of refresh control signals each corresponding to each group of the plurality of memory banks; and a control signal generation circuit suitable for generating the plurality of refresh control signals sequentially activated based on a refresh signal, and changing the row address corresponding to each round for activations of the plurality of refresh control signals, wherein an activation section of the last refresh control signal among the plurality of refresh control signals and an activation section of the first refresh control signal among the plurality of refresh control signals for a subsequent round partially overlap with each other.

BRIEF DESCRIPTION OF THE DRAWINGS

FIG. 6 is a waveform diagram illustrating a refresh operation of the memory shown in FIG. 3.

DETAILED DESCRIPTION

Figure 1:
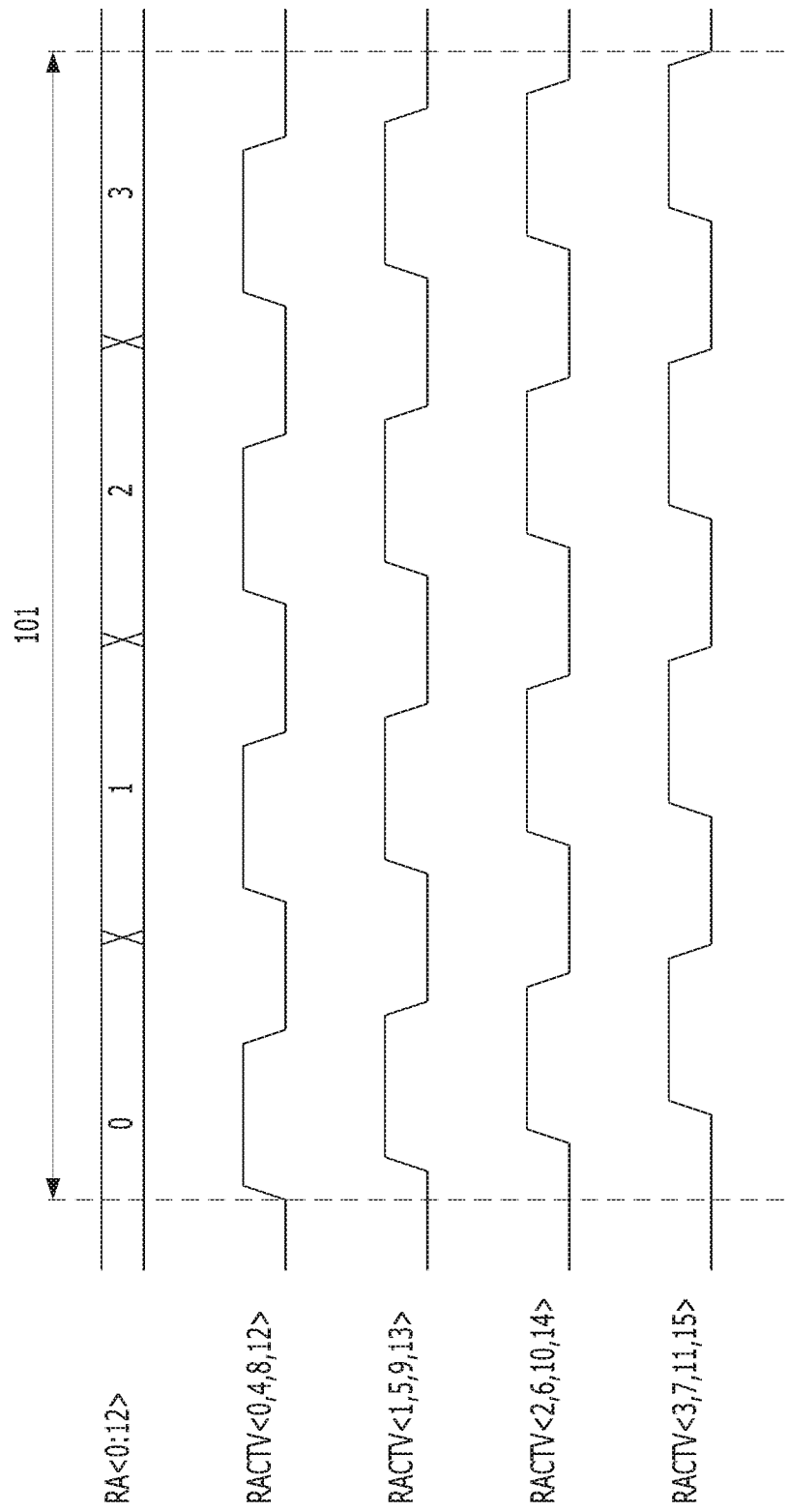
FIG. 1. is a waveform diagram illustrating an example of a refresh operation of a memory according to a single refresh command.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Hereinafter, the various embodiments of the present invention will be described in detail with reference to the attached drawings.

FIG. 1 is a waveform diagram illustrating an example of a refresh operation of a memory according to a single refresh command.

Referring to FIG. 1, a refresh address RA<0:12> may represent a refresh address used for a refresh operation of the memory. For example, when the refresh address RA<0:12> is '0', a $0^{th}$ row (i.e., word line) may be refreshed. When the refresh address RA<0:12> is '1', a first row may be refreshed. RACTV may represent a refresh control signal RACTV. The numbers attached to the refresh control signal RACTV may represent memory banks to be refreshed based on the corresponding refresh control signal. For example, when the refresh control signal RACTV<0, 4, 8, 12> is activated, the $0^{th}$, $4^{th}$, $8^{th}$, and $12^{th}$ memory banks may be refreshed, and the refresh control signal RACTV<1, 5, 9, 13> is activated, the $1^{st}$, $5^{th}$, $9^{th}$ and $13^{th}$ memory banks may be refreshed.

Referring to FIG. 1, the $0^{th}$ rows may be refreshed in the $0^{th}$, $4^{th}$, $8^{th}$, and $12^{th}$ memory banks, and then the $0^{th}$ rows may be refreshed in the $1^{st}$, $5^{th}$, $9^{th}$ and $13^{th}$ memory banks, and then the $0^{th}$ rows may be refreshed in the $2^{nd}$, $6^{th}$, $10^{th}$, and $14^{th}$ memory banks, and then the $0^{th}$ rows may be refreshed in the $3^{rd}$, $7^{th}$, $11^{th}$ and $15^{th}$ memory banks.

After the $0^{th}$ rows are completely refreshed in the $3^{rd}$, $7^{th}$, $11^{th}$ and $15^{th}$ memory banks, an operation of refreshing the first rows in the $0^{th}$, $4^{th}$, $8^{th}$, and $12^{th}$ memory banks and refreshing the first rows in the other memory banks may be sequentially performed.

Through the operation, the $0^{th}$, $1^{st}$, $2^{nd}$, and $3^{rd}$ rows may be refreshed in the $0^{th}$ to $15^{th}$ memory banks. Thereafter, when the refresh command is applied again to the memory, the $4^{th}$, $5^{th}$, $6^{th}$, and $7^{th}$ rows may be refreshed in the $0^{th}$ to $15^{th}$ memory banks in the same manner.

In FIG. 1, '101' may represent the time taken for a refresh operation corresponding to a single refresh command in the memory, and the time has to be within a range of the refresh cycle time (tRFC) specified in the specification. In FIG. 1, the memory banks may be divided into four groups for the same numbered rows, during a refresh operation. This refresh operation may be referred to as a 4-piled refresh operation.

Figure 2:
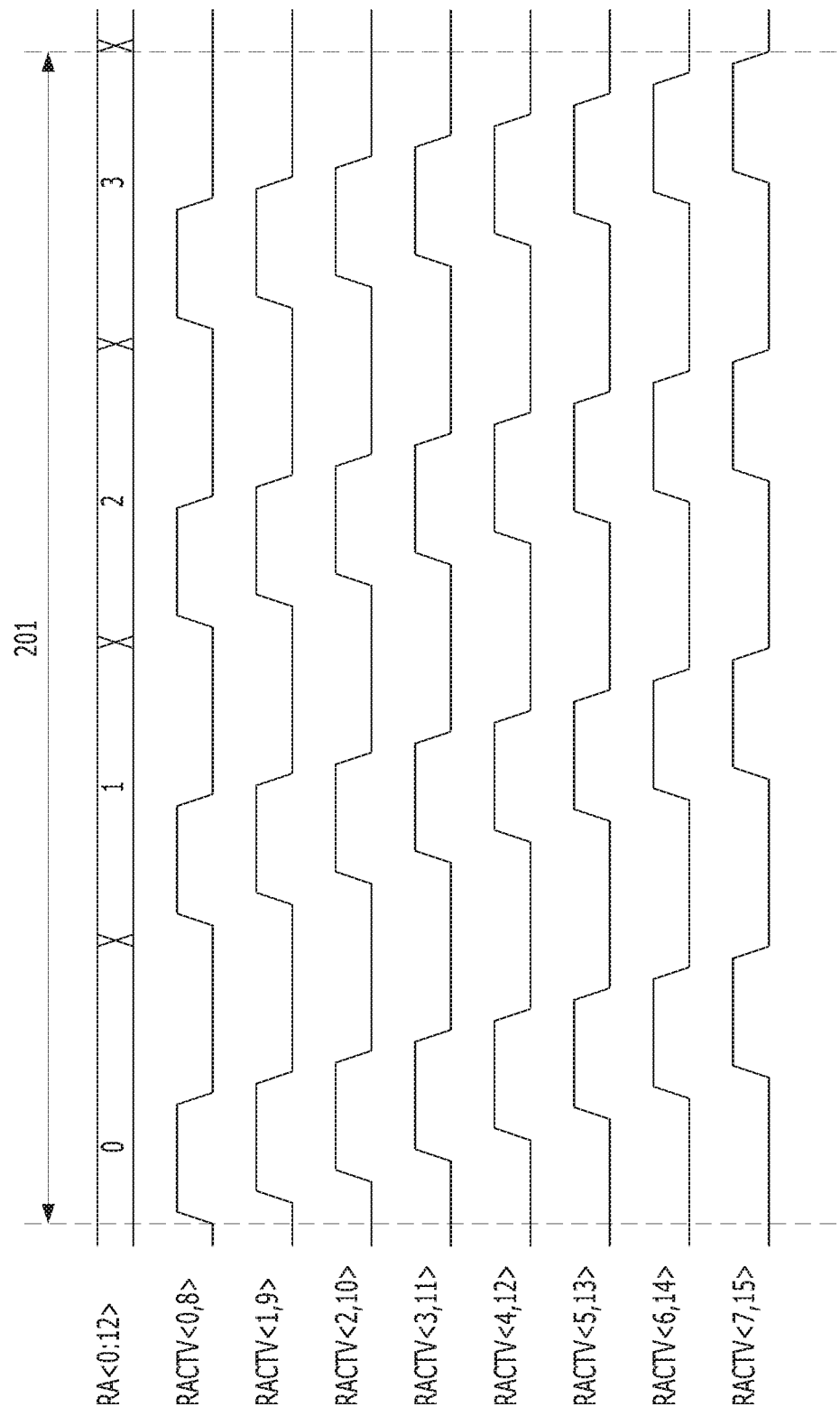
FIG. 2 is a waveform diagram illustrating another example of a refresh operation of the memory according to a single refresh command.

FIG. 2 is a waveform diagram illustrating another example of a refresh operation of the memory according to a single refresh command. In FIG. 2, two memory banks may be simultaneously refreshed, which is different from what is shown in FIG. 1.

Referring to FIG. 2, the $0^{th}$ rows may be first refreshed in the $0^{th}$ and eighth memory banks, and then the $0^{th}$ rows may be refreshed in the first and ninth memory banks, and then the $0^{th}$ rows may be refreshed in the second and $10^{th}$ memory banks, and then the 0th to rows may be refreshed in the third and $11^{th}$ memory banks, and then the $0^{th}$ rows may be refreshed in the $4^{th}$ and $12^{th}$ memory banks, and then the $0^{th}$ rows may be refreshed in the $5^{th}$ and $13^{th}$ memory banks, and then the $0^{th}$ rows may be refreshed in the $6^{th}$ and $14^{th}$ memory banks, and then the $0^{th}$ rows may be refreshed in the $7^{th}$ and $15^{th}$ memory banks.

After the $0^{th}$ rows are completely refreshed in the $7^{th}$ and $15^{th}$ memory banks, an operation of refreshing the first rows of the $0^{th}$ and $9^{th}$ memory banks and refreshing the first rows of the other memory banks may be sequentially performed.

Through this operation, the $0^{th}$, $1^{st}$, $2^{nd}$ and $3^{rd}$ rows may be refreshed in the $0^{th}$ to $15^{th}$ memory banks. Subsequently, when the refresh command is applied again to the memory, the $4^{th}$, $5^{th}$, $6^{th}$, and $7^{th}$ rows in the $0^{th}$ to $15^{th}$ memory banks may be refreshed in the same manner.

In FIG. 2, '201' may represent the time required for a refresh operation corresponding to a single refresh command in the memory, and the time has to be within a range of the tRFC specified in the specification. In FIG. 2, the memory banks may be divided into eight groups for the same numbered rows, during a refresh operation. This refresh operation may be referred to as an 8-piled refresh operation.

Since the refresh operation consumes a lot of current, the refresh operation has to be distributively performed within a given time. To this end, an 8-piled refresh operation may be more advantageous over a 4-piled refresh operation. In addition, it is advantageous to increase the refresh activation interval between the refresh control signals RACTV (e.g., the activation timing difference between RACTV<0, 8> and RACTV<1, 9>). However, this increases the time required for a refresh operation, making it difficult to keep the tRFC value specified in the specification of the memory.

Figure 3:
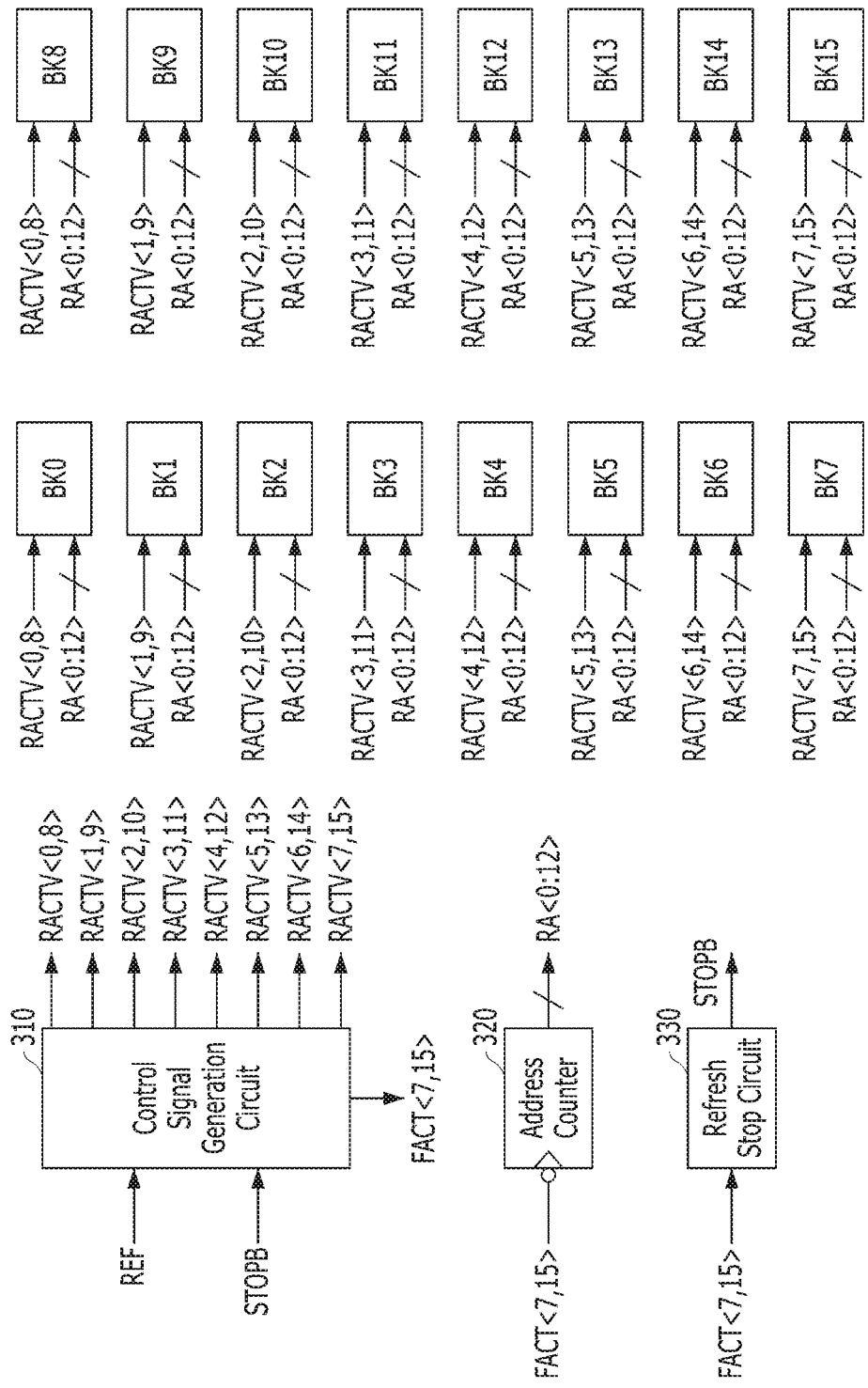
FIG. 3 is a block diagram illustrating a memory in accordance with an embodiment of the present invention.

FIG. 3 is a block diagram illustrating a memory in accordance with an embodiment of the present invention.

Referring to FIG. 3, the memory may include first to eighth areas (i.e., memory areas), a control signal generation circuit 310, an address counter 320, and a refresh stop circuit 330.

The first area may include a V memory bank BK0 and an 8$^{th}$ memory bank BK8. The rows corresponding to a refresh address RA<0:12> may be refreshed in the memory banks BK0 and BK8 of the first area when first refresh control signal RACTV<0, 8> is activated.

The second area may include the first memory bank BK1 and the ninth memory bank BK9. The rows corresponding to the refresh address RA<0:12> may be refreshed in the memory banks of the second area when a second refresh control signal RACTV<1, 9> is activated. Similarly, the third area may include the second memory bank BK2 and the 10$^{th}$ memory bank BK10, and the fourth area may include the third memory bank BK3 and the 11$^{th}$ memory bank BK11. The fifth area may include the fourth memory bank BK4 and the 12$^{th}$ memory bank BK12. The sixth area may include the fifth memory bank BK5 and the 13$^{th}$ memory bank BK13, and the seventh area may include the sixth memory bank BK6 and the 14th memory bank BK14. The eighth area may include the seventh memory bank BK7 and the 15$^{th}$ memory bank BK15. In the third to eighth areas, just as in the first area, the rows corresponding to the refresh address RA<0:12> may be refreshed when the third to eighth refresh control signals RACTV<2, 10>, RACTV<3, 11>, RACTV<4, 12>, RACTV<5, 13>, RACTV<6, 14>, and RACTV<7, 15> are activated, respectively.

The control signal generation circuit 310 may generate the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15> based on a refresh signal REF which is a signal internally activated when a refresh command is applied to the memory. The control signal generation circuit 310 may activate the first refresh control signal RACTV<0, 8> in response to the activation of the refresh signal REF, activate the second to eighth refresh control signals RACTV<1, 9>, RACTV<2, 10>, RACTV<3, 11>, RACTV<4, 12>, RACTV<5, 13>, RACTV<6, 14>, and RACTV<7, 15> by sequentially delaying the first refresh control signal RACTV<0, 8>, and activate the first refresh control signal RACTV<0, 8> again by delaying the eighth refresh control signal RACTV<7, 15>. The control signal generation circuit 310 may stop activating the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15> in response to a stop signal STOPB.

The address counter 320 may change a value of the refresh address RA<0:12> in response to the eighth refresh control signal RACTV<7, 15> which are the signal activated last among the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15>. For example, the address counter 320 may increase the value of the refresh address RA<0:12> by '1' whenever the eighth refresh control signal RACTV<7, 15> is activated. In the figure, the address counter 320 may change the value of the refresh address RA<0:12> in response to a falling edge of an eighth pulse signal FACT<7, 15>. The eighth pulse signal FACT<7, 15> is activated at substantially the same time as the eighth refresh control signal RACTV<7, 15> and deactivated before the eighth refresh control signal RACTV<7, 15>, and therefore eventually the address counter 320 may be considered to operate in response to the activation of the eighth refresh control signal RACTV<7, 15>.

The refresh stop circuit 330 may generate the stop signal STOPB for stopping the refresh operation, when the activation of the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15> is repeated by the predetermined number of rounds. Herein, the predetermined number of rounds may vary depending on how many rows are to be refreshed when a single refresh command is applied to the memory. For example, when the predetermined number of rounds is 4, 4 rows may be refreshed for each of the memory banks BK0 to BK15 whenever a single refresh command is applied to the memory. When the predetermined number of rounds is 6, six rows may be refreshed for each of the memory banks BK0 to BK15 whenever a single refresh command is applied to the memory. The refresh stop circuit 330 may be able to figure out how many rounds the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15> are activated based on the eighth pulse signal FACT<7, 15>.

Although FIG. 3 illustrates an example where the memory is divided into eight areas and each area includes two memory banks, it is obvious to those skilled in the art that the number of areas and the number of memory banks included in each area may be different.

Figure 4:
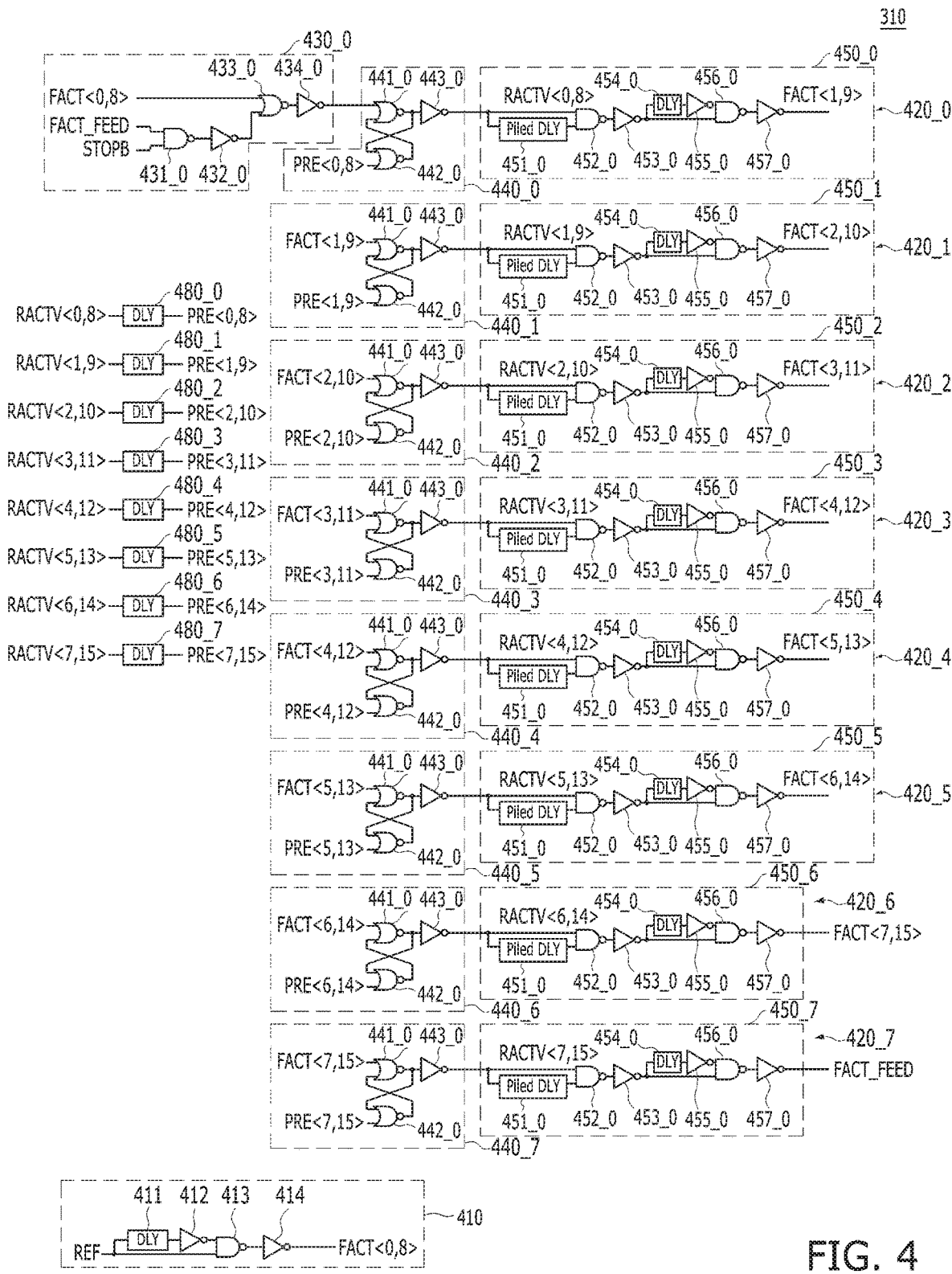
FIG. 4 is a detailed diagram illustrating a control signal generation circuit shown in FIG. 3.

FIG. 4 is a detailed diagram of the control signal generation circuit 310 shown in FIG. 3.

Referring to FIG. 4, the control signal generation circuit 310 may include a pulse generator 410, first to eighth delay circuits 420_0 to 420_7, and first to eighth precharge delay circuits 480_0 to 480_7.

The pulse generator 410 may generate a first pulse signal FACT<0, 8> based on the refresh signal REF. The pulse generator 410 may include a delay line 411, an inverter 412, a NAND gate 413 and an inverter 414. The pulse generator 410 may generate a first pulse signal FACT<0, 8> which is activated while the refresh signal REF and an output signal of the inverter 412 obtained by delaying and inverting the refresh signal REF are both in a logic high level. That is, the pulse generator 410 may be formed as a rising edge detector, and the first pulse signal FACT<0, 8> may be activated at a rising edge of the refresh signal REF.

When one or more pulse signals between the first pulse signal FACT<0, 8> and the ninth pulse signal FACT_FEED are activated, the first delay circuit 420_0 may activate the first refresh control signal RACTV<0, 8>. When a first precharge signal PRE<0, 8> is activated, the first delay circuit 420_0 may deactivate the first refresh control signal RACTV<0, 8>. Also, the first delay circuit 420_0 may generate the second pulse signal FACT<1, 9> by delaying the first refresh control signal RACTV<0, 8>. The first delay circuit 420_0 may include a logic combiner 430_0, an SR latch 440_0, and a delayer 450_0.

The logic combiner 430._0 may include a NAND gate 431_0, an inverter 432_0, a NOR gate 433_0, and an inverter 434_0. An output signal of the logic combiner 430_0 may be inputted to a set terminal of the SR latch 440_0. When the stop signal STOPB is deactivated to a logic high level, the logic combiner 430_0 may activate the signal inputted to the set terminal of the SR latch 440_0 to a logic high level if one or more signals between the first pulse signal FACT<0, 8> and the ninth pulse signal FACT_TEED are activated to a logic high level. However, when the stop signal STOPB is activated to a logic low level, the logic combiner 430_0 may not activate the signal inputted to the set terminal of the SR latch 440_0 to a logic high level even if the ninth pulse signal FACT_FEED is activated to a logic high level.

The SR latch 440_0 may include two cross-coupled NOR gates 441_0 and 442_0 and an inverter 443_0. When the signal inputted to the set terminal, that is, the output signal of the inverter 434_0, is activated to a logic high level, the SR latch 440_0 may activate the first refresh control signal RACTV<0, 8> to a logic high level. When the first precharge signal PRE<0, 8> inputted to a reset terminal of the SR latch 440_0 is activated, the SR latch 440_0 may deactivate the first refresh control signal RACTV<0, 8> to a logic low level.

The delayer 450_0 may include a delay line (Piled DLY) 451_0, a NAND gate 452_0, an inverter 453_0, a delay line (©LY) 454_0, an inverter 455_0, a NAND gate 456_0, and an inverter 457_0. The delayer 450_0 may generate the second pulse signal FACT<1, 9> by delaying the first refresh control signal RACTV<0, 8>. The difference between the activation timing of the first refresh control signal RACTV<0, 8> and the activation timing of the second pulse signal FACT<1, 9> may be determined based on a delay value of the delay line 451_0, and a pulse width of the second pulse signal FACT<1, 9> may be determined by the delay line 454_0.

When the second pulse signal FACT<1, 9> is activated, the second delay circuit 420_1 may activate the second refresh control signal RACTV<1, 9>. When a second precharge signal PRE<1, 9> is activated, the second delay circuit 420_1 may deactivate the second refresh control signal RACTV<1, 9>. The second delay circuit 420_1 is may generate a third pulse signal FACT<2, 10> by delaying the second refresh control signal RACTV<1, 9>. The second delay circuit 420_1 may include an SR latch 440_1 and a delayer 450_1. When the second pulse signal FACT<1, 9> is activated to a logic high level, the SR latch 440_1 may activate the second refresh control signal RACTV<1, 9> to a logic high level. When the second precharge signal PRE<1, 9> is activated to a logic high level, the SR latch 440_1 may deactivate the second refresh control signal RACTV<1, 9> to a logic low level. The delayer 450_1 may generate the third pulse signal FACT<2, 10> by delaying the second refresh control signal RACTV<1, 9>. The SR latch 440_1 and the delayer 450_1 of the second delay circuit 420_1 may be designed the same as the SR latch 440_0 and the delayer 450_0 of the first delay circuit 420_0.

When the third pulse signal FACT<2, 10> is activated, the third delay circuit 420_2 may activate the third refresh control signal RACTV<2, 10>. When a third precharge signal PRE<2, 10> is activated, the third delay circuit 420_2 may deactivate the third refresh control signal RACTV<2, 10>. The third delay circuit 420_2 may generate a fourth pulse signal FACT<3, 11> by delaying the third refresh control signal RACTV<2, 10>. The third delay circuit 420_2 may include an SR latch 440_2 and a delayer 450_2. When the third pulse signal FACT<2, 10> is activated to a logic high level, the SR latch 440_2 may activate the third refresh control signal RACTV<2, 10> to a logic high level. When the third precharge signal PRE<2, 10> is activated to a logic high level, the SR latch 440_2 may deactivate the third refresh control signal RACTV<2, 10> to a logic low level. The delayer 450_2 may generate the fourth pulse signal FACT<3, 11> by delaying the third refresh control signal RACTV<2, 10>. The SR latch 440_2 and the delayer 450_2 of the third delay circuit 420_2 may be designed the same as the SR latch 440_0 and the delayer 450_0 of the first delay circuit 420_0.

When the fourth pulse signal FACT<3, 11> is activated, the fourth delay circuit 420_3 may activate the fourth refresh control signal RACTV<3, 11>. When a fourth precharge signal PRE<3, 11> is activated, the fourth delay circuit 420_3 may deactivate the fourth refresh control signal RACTV<3, 11>. The fourth delay circuit 420_3 may generate a fifth pulse signal FACT<4, 12> by delaying the fourth refresh control signal RACTV<3, 11>. The fourth delay circuit 420_3 may include an SR latch 440_3 and a delayer 450_3. When the fourth pulse signal FACT<3, 11> is activated to a logic high level, the SR latch 440_3 may activate the fourth refresh control signal RACTV<3, 11> to a logic high level. When the fourth precharge signal PRE<3, 11> is activated to a logic high level, the SR latch 440_3 may deactivate the fourth refresh control signal RACTV<3, 11> to a logic low level. The delayer 450_3 may generate the fifth pulse signal FACT<4, 12> by delaying the fourth refresh control signal RACTV<3, 11>. The SR latch 440_3 and the delayer 450_3 of the fourth delay circuit 420_3 may be designed the same as the SR latch 440_0 and the delayer 450_0 of the first delay circuit 420_0.

When the fifth pulse signal FACT<4, 12> is activated, the fifth delay circuit 420_4 may activate the fifth refresh control signal RACTV<4, 12>. When a fifth precharge signal PRE<4, 12> is activated, the fifth delay circuit 420_4 may deactivate the fifth refresh control signal RACTV<4, 12>. The fifth delay circuit 420_4 may generate a sixth pulse signal FACT<5, 13> by delaying the fifth refresh control signal RACTV<4, 12>. The fifth delay circuit 420_4 may include an SR latch 440_4 and a delayer 450_4. When the fifth pulse signal FACT<4, 12> is activated to a logic high level, the SR latch 440_4 may activate the fifth refresh control signal RACTV<4, 12> to a logic high level. When the fifth precharge signal PRE<4, 12> is activated to a logic high level, the SR latch 440_4 may deactivate the fifth refresh control signal RACTV<4, 12> to a logic low level. The delayer 450_4 may generate the sixth pulse signal FACT<5, 13> by delaying the fifth refresh control signal RACTV<4, 12>. The SR latch 440_4 and the delayer 450_4 of the fifth delay circuit 420_4 may be designed the same as the SR latch 440_0 and the delayer 450_0 of the first delay circuit 420_0.

When the sixth pulse signal FACT<5, 13> is activated, the sixth delay circuit 420_5 may activate the sixth refresh control signal RACTV<5, 13>. When a sixth precharge signal PRE<5, 13> is activated, the sixth delay circuit 420_5 may deactivate the sixth refresh control signal RACTV<5, 13>. The sixth delay circuit 420_5 may generate a seventh pulse signal FACT<6, 14> by delaying the sixth refresh control signal RACTV<5, 13>. The sixth delay circuit 420_5 may include an SR latch 440_5 and a delayer 450_5. When the sixth pulse signal FACT<5, 13> is activated to a logic high level, the SR latch 440_5 may activate the sixth refresh control signal RACTV<5, 13> to a logic high level. When the sixth precharge signal PRE<5, 13> is activated to a logic high level, the SR latch 440_5 may deactivate the sixth refresh control signal RACTV<5, 13> to a logic low level. The delayer 450_5 may generate the seventh pulse signal FACT<6, 14> by delaying the sixth refresh control signal RACTV<5, 13>. The SR latch 440_5 and the delayer 450_5 of the sixth delay circuit 420_5 may be designed the same as the SR latch 440_0 and the delayer 450_0 of the first delay circuit 420_0.

When the seventh pulse signal FACT<6, 14> is activated, the seventh delay circuit 420_6 may activate the seventh refresh control signal RACTV<6, 14>. When a seventh precharge signal PRE<6, 14> is activated, the seventh delay circuit 420_6 may deactivate the seventh refresh control signal RACTV<6, 14>. The seventh delay circuit 420_6 may generate an eighth pulse signal FACT<7, 15> by delaying the seventh refresh control signal RACTV<6, 14>. The seventh delay circuit 420_6 may include an SR latch 440_6 and a delayer 450_6. When the seventh pulse signal FACT<6, 14> is activated to a logic high level, the SR latch 440_6 may activate the seventh refresh control signal RACTV<6, 14> to a logic high level. When the seventh precharge signal PRE<6, 14> is activated to a logic high level, the SR latch 440_6 may deactivate the seventh refresh control signal RACTV<6, 14> to a logic low level. The delayer 450_6 may generate the eighth pulse signal FACT<7, 15> by delaying the seventh refresh control signal RACTV<6, 14>. The SR latch 440_6 and the delayer 450_6 of the seventh delay circuit 420_6 may be designed the same as the SR latch 440_0 and the delayer 450_0 of the first delay circuit 420_0.

When the eighth pulse signal FACT<7, 15> is activated, the eighth delay circuit 420_7 may activate the eighth refresh control signal RACTV<7, 15>. When an eighth precharge signal PRE<7, 15> is activated, the eighth delay circuit 420_7 may deactivate the eighth refresh control signal RACTV<7, 15>. The eighth delay circuit 420_7 may generate a ninth pulse signal FACT_FEED by delaying the eighth refresh control signal RACTV<7, 15>. The eighth delay circuit 420_7 may include an SR latch 440_7 and a delayer 450_7. When the eighth pulse signal FACT<7, 15> is activated to a logic high level, the SR latch 440_7 may activate the eighth refresh control signal RACTV<7, 15> to a logic high level. When the eighth precharge signal PRE<7, 15> is activated to a logic high level, the SR latch 440_5 may deactivate the eighth refresh control signal RACTV<7, 15> to a logic low level. The delayer 450_7 may generate the ninth pulse signal FACT_FEED by delaying the eighth refresh control signal RACTV<7, 15>. The SR latch 440_7 and the delayer 450_7 of the eighth delay circuit 420_7 may be designed the same as the SR latch 440_0 and the delayer 450_0 of the first delay circuit 420_0.

The first precharge delay circuit 480_0 may generate the first precharge signal PRE<0, 8> by delaying the first refresh control signal RACTV<0, 8>. A delay value of the first precharge delay circuit 480_0 may correspond to a width of the activation section of the first refresh control signal RACTV<0, 8>. The second to eighth precharge delay circuits 480_1 to 480_7 may generate second to eighth precharge signals PRE<1, 9>, PRE<2, 10>, PRE<3, 11>, PRE<4, 12>, PRE<5, 13>, PRE<6, 14>, and PRE<7, 15> by delaying the second to eighth refresh control signals RACTV<1, 9>, RACTV<2, 10>, RACTV<3, 11>, RACTV<4, 12>, RACTV<5, 13>, RACTV<6, 14>, and RACTV<7, 15>, respectively, in the same manner as the first precharge delay circuit 480_0.

Figure 5:
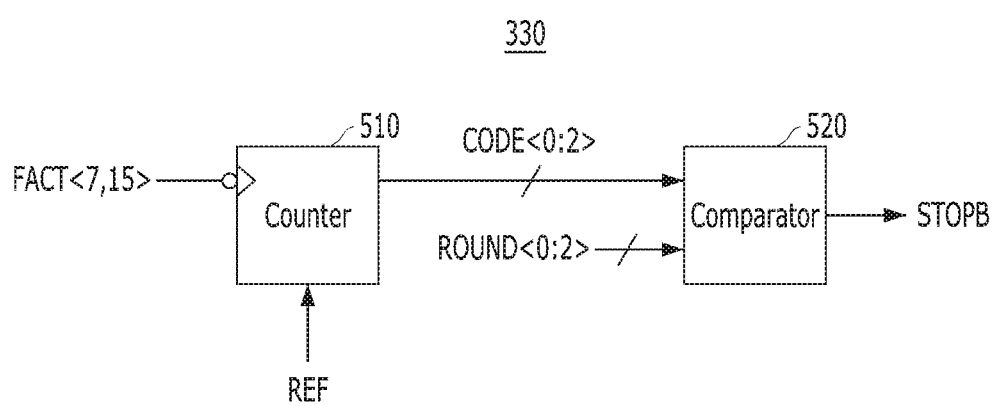
FIG. 5 is a detailed diagram illustrating a refresh stop circuit shown in FIG. 3.

FIG. 5 is a detailed diagram of the refresh stop circuit 330 shown in FIG. 3.

Referring to FIG. 5, the refresh pause circuit 330 may include a counter 510 and a comparator 520.

The counter 510 may increase a value of a code CODE<0:2> (i.e., a counting value) in response to a falling edge of the eighth pulse signal FACT<7, 15>. The eighth pulse signal FACT<7, 15> may be activated at substantially the same moment as the eighth refresh control signal RACTV<7, 15> and deactivated before the eighth refresh control signal RACTV<7, 15>. Therefore, the value of the code CODE<0:2> may increase whenever the eighth refresh control signal RACTV<7, 15> is activated. Also, the counter 510 may initialize the value of the code CODE<0:2> to 0 in response to deactivation of the refresh signal REF. The value of the code CODE<0:2> generated by the counter 510 may represent how many rounds the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15> are activated during a refresh operation. For example, if the value of the code CODE<0:2> is 3, it may be decided that the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15> are activated three times.

The comparator 520 may compare the value of the code CODE<0:2> with a predetermined round value ROUND<0:2> and activate the stop signal STOPB to a logic low level when the two values are the same. Hereinafter, it is assumed that the predetermined round value is '4'.

FIG. 6 is a waveform diagram for describing a refresh operation of the memory shown in FIG. 3.

Referring to FIG. 6, the refresh signal REF may be activated at a moment '601', and the first refresh control signal RACTV<0, 8> may be activated in response to the refresh signal REF. The second to eighth refresh control signals RACTV<1, 9>, RACTV<2, 10>, RACTV<3, 11>, RACTV<4, 12>, RACTV<5, 13>, RACTV<6, 14>, and RACTV<7, 15> may be sequentially activated. In this way, a refresh operation for the $0^{th}$ row may be performed in the memory banks BK0 to BK15.

The row address may be changed into '1' in response to the eighth refresh control signal RACTV<7, 15> which is activated at a moment 602, and the first refresh control signal RACTV<0, 8> may be activated again at a moment 603. After the moment 603, the second to eighth refresh control signals RACTV<1, 9>, RACTV<2, 10>, RACTV<3, 11>, RACTV<4, 12>, RACTV<5, 13>, RACTV<6, 14>, and RACTV<7, 15> may be sequentially activated. In this way, the refresh operation for the first row may be performed in the memory banks BK0 to BK15.

The row address may be changed into '2' in response to the eighth refresh control signal RACTV<7, 15> which is activated at a moment 604, and the first refresh control signal RACTV<0, 8> may be activated again at a moment 605. After the moment 605, the second to eighth refresh control signals RACTV<1, 9>, RACTV<2, 10>, RACTV<3, 11>, RACTV<4, 12>, RACTV<5, 13>, RACTV<6, 14>, and RACTV<7, 15> may be sequentially activated. In this way, the refresh operation for the second row may be performed in the memory banks BK0 to BK15.

The row address may be changed into '3' in response to the eighth refresh control signal RACTV<7, 15> which is activated at a moment 606, and the first refresh control signal RACTV<0, 8> may be activated again at a moment 607. After the moment 607, the second to eighth refresh control signals RACTV<1, 9>, RACTV<2, 10>, RACTV<3, 11>, RACTV<4, 12>, RACTV<5, 13>, RACTV<6, 14>, and RACTV<7, 15> may be sequentially activated. In this way, the refresh operation for the third row may be performed in the memory banks BK0 to BK15.

Since the stop signal STOPB is activated in response to the eighth refresh control signal RACTV<7, 15> which is activated at a moment '608', the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15> may not be activated anymore.

Through these series of operations, a refresh operation for four rows in each of the memory banks BK0 to BK15 may be performed.

In the refresh operation shown in FIGS. 1 and 2, the refresh operation is distinguished for each round. For example, in FIG. 2, the activation sections of the neighboring refresh control signals may overlap with each other among the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15>, but the first refresh control signal RACTV<0, 8> may be activated to make the refresh operation of the next round be performed only after the eighth refresh control signal RACTV<7, 15> is activated and then deactivated. In other words, whenever the row address RA<0:12> is changed, a section where no refresh control signal is activated, is caused.

However, in the refresh operation of FIG. 6, the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15> may be continuously and uniformly activated regardless of rounds. Therefore, an amount of current consumed during the refresh operation may be evenly distributed. Also, a section where no refresh control signal is activated, is not caused when the row address RA<0:12> is changed. That is, the activation section of the eighth refresh control signal RACTV<7, 1.5> and the activation section of the first refresh control signal RACTV<0, 8> for the subsequent round partially overlap with each other. Therefore, the time required for the refresh operation may be reduced. For example, the time '610' required for the refresh operation in FIG. 6 may be shorter than the time '201' required for the refresh operation in FIG. 2.

Also, when the refresh operation is performed for the same time, the time difference between the first to eighth refresh control signals RACTV<0, 8>, RACTV<1, 9>, RACTV<2, 10>, RACTV<3, 11>, RACTV<4, 12>, RACTV<5, 13>, RACTV<6, 14>, and RACTV<7, 15>, which may be called piled delay, may be set to be large, which is advantageous.

According to the embodiments of the present invention, effectively refresh a plurality of areas (i.e., memory banks) of a memory may be effectively refreshed.

While the present invention has been described with respect to the specific embodiments, it will be apparent to those skilled in the art that various changes and modifications may be made without departing from the spirit and scope of the invention as defined in the following claims.

What is claimed is:

1. A memory comprising:
    first to $N^{th}$ areas refreshed based on first to $N^{th}$ refresh control signals, respectively;
    a control signal generation circuit suitable for generating the second to $N^{th}$ refresh control signals by sequentially delaying the first refresh control signal, and generating the first refresh control signal by delaying the $N^{th}$ refresh control signal;
    an address counter suitable for changing a refresh address, corresponding to each round for activations of the first to $N^{th}$ refresh control signals, based on the $N^{th}$ refresh control signal; and
    a refresh stop circuit suitable for stopping a refresh operation when the round is repeated by a predetermined number.

2. The memory of claim 1, wherein the first refresh control signal is activated before the $N^{th}$ refresh control signal corresponding to a previous round is deactivated.

3. The memory of claim 1, wherein activation sections of neighboring refresh control signals among the first to $N^{th}$ refresh control signals partially overlap with each other.

4. The memory of claim 1, wherein the control signal generation circuit includes:
    a pulse generator suitable for generating a first pulse signal based on a refresh signal;
    a first delay circuit suitable for activating the first refresh control signal when one or more pulse signals among the first pulse signal and an $(N+1)^{th}$ pulse signal are activated, and generating a second pulse signal by delaying the first refresh control signal; and
    second to $N^{th}$ delay circuits suitable for activating the second to $N^{th}$ refresh control signals when second to $N^{th}$ pulse signals are activated, and generating third to $(N+1)^{th}$ pulse signals by delaying the second to $N^{th}$ refresh control signals.

5. The memory of claim 4, wherein the control signal generation circuit further includes:
    first to $N^{th}$ precharge delay circuits suitable for generating first to $N^{th}$ precharge signals by delaying the first to $N^{th}$ refresh control signals,
    wherein the first to $N^{th}$ delay circuits deactivate the first to $N^{th}$ refresh control signals when the first to $N^{th}$ precharge signals are activated.

6. The memory of claim 1, wherein the refresh stop circuit includes:
    a counter suitable for increasing a counting value in response to the $N^{th}$ refresh signal; and
    a comparator suitable for comparing the counting value with the predetermined number of rounds and activating a stop signal for stopping a refresh operation when the counting value and the predetermined number of rounds are the same.

7. The memory of claim 6, wherein the counter initializes the number of rounds value when the refresh signal is deactivated.

8. The memory of claim 1, wherein, in each of the first to $N^{th}$ areas, a row corresponding to the refresh address is activated when a refresh control signal corresponding thereto among the first to $N^{th}$ refresh control signals is activated.

9. The memory of claim 1, wherein each of the first to $N^{th}$ areas includes one or more memory banks.

10. An operation method of a memory including first to $N^{th}$ areas (where N is an integer equal to or greater than 2), the operation method comprising:
    sequentially refreshing the first to $N^{th}$ areas for a $K^{th}$ address (where K is an integer equal to or greater than 0);
    starting a refresh operation for a $(K+1)^{th}$ address in the first area before a refresh operation for the $K^{th}$ address in the $N^{th}$ area is completed; and
    sequentially refreshing the second to $N^{th}$ regions for the $(K+1)^{th}$ address.

11. The operation method of claim 10, wherein in the sequentially refreshing the first to $N^{th}$ areas for the $K^{th}$ address,
    refresh operation sections of neighboring areas partially overlap with each other.

12. The operation method of claim 10, wherein the refresh operation for the $(K+1)^{th}$ address in the first area is completed after the refresh operation for the $K^{th}$ address in the $N^{th}$ area is completed.

13. A memory comprising:
a plurality of memory banks that are grouped for a refresh operation and refreshed based on a row address and a plurality of refresh control signals each corresponding to each group of the plurality of memory banks; and
a control signal generation circuit suitable for generating the plurality of refresh control signals sequentially activated based on a refresh signal, and changing the row address corresponding to each round for activations of the plurality of refresh control signals,
wherein an activation section of the last refresh control signal among the plurality of refresh control signals and an activation section of the first refresh control signal among the plurality of refresh control signals for a subsequent round partially overlap with each other, and
wherein during the partially overlap period, Kth address of the last memory bank of the plurality of memory banks is refreshed and (K+1)th address of the first memory bank of the plurality of memory banks is refreshed.

* * * * *